US007573097B2

(12) United States Patent  (10) Patent No.: US 7,573,097 B2
Desko et al. (45) Date of Patent: Aug. 11, 2009

(54) LATERAL DOUBLE DIFFUSED MOS TRANSISTORS

(75) Inventors: John C. Desko, Wescosville, PA (US); Roger A. Fratti, Mohnton, PA (US); Vivian Ryan, Hampton, NJ (US)

(73) Assignee: Agere Systems Inc., Allentown, PA (US)

( * ) Notice: Subject to any disclaimer, the term of this patent is extended or adjusted under 35 U.S.C. 154(b) by 806 days.

(21) Appl. No.: 10/981,175

(22) Filed: Nov. 3, 2004

(65) Prior Publication Data

US 2006/0091480 A1    May 4, 2006

(51) Int. Cl.
 *H01L 29/417*   (2006.01)
 *H01L 29/423*   (2006.01)
(52) U.S. Cl. ............... 257/331; 257/340; 257/E29.12; 257/E29.136
(58) Field of Classification Search ............... 257/204, 257/211, 331, 340, 341, 343, 289, 401, E29.112, 257/E29.116, E29.118, E29.119, E29.12, 257/E29.122, E29.136
See application file for complete search history.

(56) References Cited

U.S. PATENT DOCUMENTS

| 5,510,645 A * | 4/1996 | Fitch et al. .................. 257/522 |
| 2003/0136984 A1 * | 7/2003 | Masuda et al. .............. 257/247 |

\* cited by examiner

*Primary Examiner*—Lynne A. Gurley
*Assistant Examiner*—Andrew O Arena
(74) *Attorney, Agent, or Firm*—Peter V. D. Wilde

(57) ABSTRACT

The specification describes an improved mechanical electrode structure for MOS transistor devices with elongated runners. It recognizes that shrinking the geometry increases the likelihood of mechanical failure of comb electrode geometries. The mechanical integrity of a comb electrode is improved by interconnecting the electrode fingers in a cross-connected grid. In one embodiment, the transistor device is interconnected with gate fingers on a lower metaliization level, typically the first level metal, with the drain interconnected at a higher metal level. That allows the drain fingers to be cross-connected with a vertical separation between drain and gate comb electrodes. The cross-connect members may be further stabilized by adding beam extensions to the cross-connect members. The beam extensions may be anchored in an interlevel dielectric layer for additional support.

20 Claims, 6 Drawing Sheets

LATERAL DOUBLE DIFFUSED MOS TRANSISTORS

FIELD OF THE INVENTION

The field of the invention is design and fabrication of lateral double diffused MOS (LDMOS) transistors.

BACKGROUND OF THE INVENTION

Double diffused (DMOS) transistors are used widely in both RF analog and mixed-signal integrated circuits (ICs), and in dielectrically isolated ICs for power and high voltage applications. These devices are produced in both vertical and lateral configurations. In the lateral configuration (LDMOS) the power handling property of the device is enhanced by extending the active portion of the device along the x-y plane of the substrate. In a typical implementation the active region meanders in a serpentine pattern to increase the length to width ratio of the overall device.

The surface electrode configurations for these devices are substantially elongated, and may be relatively complex. In a common power device structure, the elongated gate and drain elements are formed in a comb configuration with the combs facing and the teeth, referred to here and below as fingers, interleaved. The surface electrodes may be drain and gate, or source and gate. In each case the third electrode is provided by the substrate. In state of the art RF LDMOS power devices the surface electrodes are typically drain and gate. In this description, conductors that provide interconnections above the surface of the semiconductor substrate may be referred to as runners.

The length-to-width ratio of the surface runners is related not only to device performance, but also to the ever-present goal of overall device miniaturization. For economy of area, the width of the runners is made as small as practical. This results in a very thin electrode structure wherein the fingers are fragile and susceptible to mechanical defects. Device failure is often attributed to these defects. Mechanical defects may occur in production, or may arise later as a result of stress aging.

Improvement in the mechanical performance of elongated runners would represent a significant advance in LDMOS and related device technology.

STATEMENT OF THE INVENTION

We have developed an improved mechanical structure for MOS transistor devices with elongated runners. It recognizes that shrinking the geometry increases the likelihood of mechanical failure of comb electrode geometries. The mechanical integrity of the comb electrode is improved by interconnecting the electrode fingers in a cross-connected grid. In one embodiment, the transistor device is interconnected with gate fingers on a lower metaliization level, typically the first level metal, with the drain interconnected at a higher metal level. That allows the drain fingers to be cross-connected with vertical separation between drain and gate combs. The drain comb, with cross-connections, may be formed at the second level, but preferably skips a level to, for example, the third level, to increase the separation and potential capacitive coupling between the drain and gate. To further reduce capacitive coupling, an interlevel ground plane may be used. The ground plane may be formed in the skipped level.

In another embodiment, the cross-connects are provided with beam extensions to aid in mechanically balancing the cross connects. The beam extensions may be anchored in an interlevel dielectric layer for additional support.

DETAILED DESCRIPTION

In state of the art RF LDMOS power devices the surface electrodes are typically drain and gate, with the gate interconnections formed on the first level. That device format will be used in the following description to illustrate the invention. However, it should be understood that the invention may apply to other device configurations.

Figure 1:
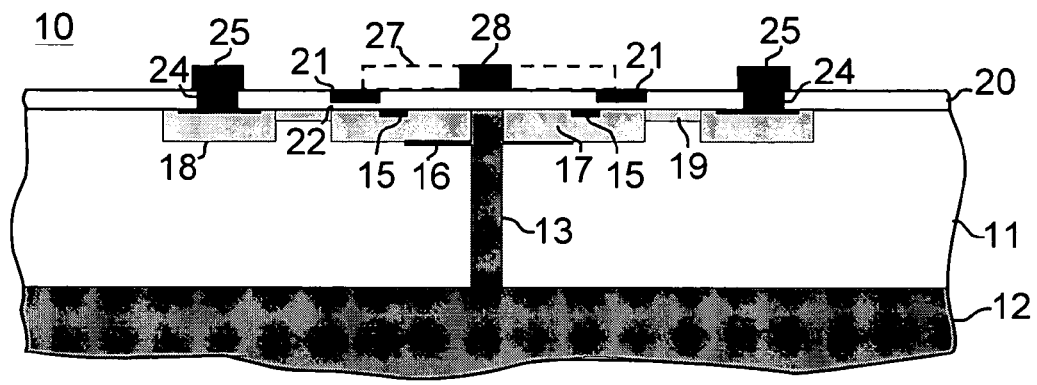
FIG. 1 is a section view of an LDMOS device showing conventional transistor elements in a conventional configuration.

Referring to FIG. 1, an RF LDMOS device is shown generally at 10, with p-type epitaxial substrate 11 and p+ buried region 12. The buried region in this device configuration comprises the source and is formed by well-known implant and epitaxial growth techniques. The buried region is accessed electrically via source sinker 13. It is noted that the elements in the figures are not drawn to scale. The transistor source comprises n+ implant 15, with deep p+ implant 16 and surface p-type implant 17 forming the drift region. The drain implant is shown at 18, and the lightly doped drain extension (LDD) at 19. The basic device structure just described is well known, as are methods for producing it. The most relevant part of the device comprises the interconnection structure above the surface of substrate 11. These are polysilicon or metal contacts comprising polysilicon gates 21 that are formed on gate dielectric 22, drain plugs 24, and drain contacts 25. Also shown in this view is gate strap 27 that connects the two gates 21. Gate strap 27 is shown with a dashed line to indicate that it is not continuous along the gate length (there may be several spaced apart straps). The straps are connected to a center runner 28 that serves as the main gate interconnection runner. The first interlevel dielectric layer is designated 20. Not shown in this figure, for simplicity, is a surface contact over the source region and a series of source/gate straps that connect the gate and source, a well-known transistor feature. The structures just described comprise the first level metal. They are typically formed in a step sequence comprising forming the field oxide, patterning the field oxide to form windows at the transistor sites, growing a gate dielectric layer, depositing a polysilicon gate layer, patterning at least the polysilicon gate layer to define the gate structure, depositing the first interlevel dielectric, forming contact windows in the first level dielectric, forming interlevel plugs in the contact windows, and depositing and patterning the first level metal. There may be variations on this general step sequence but the basic elements necessary for the transistor interconnections will be the same or similar. Typically the gate interconnections are completed at this level by interconnecting the gate fingers with a gate rail as shown in FIG. 2

Figure 2:
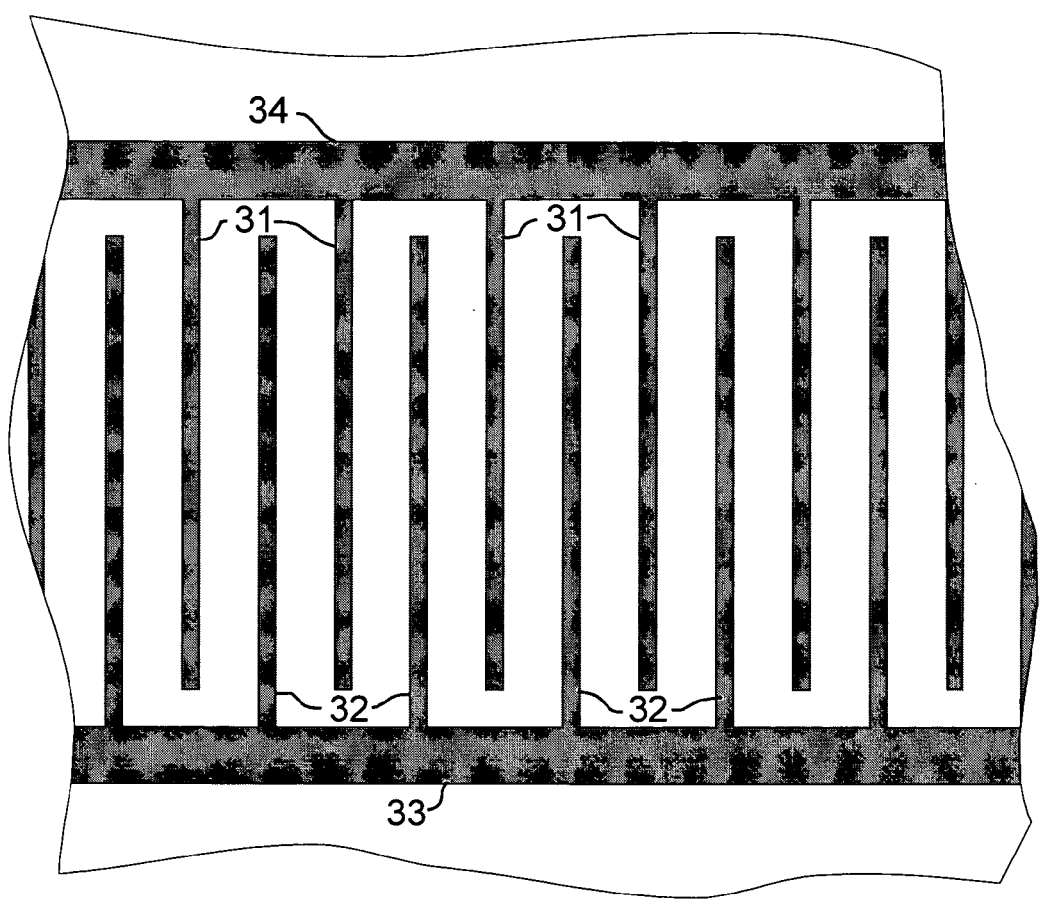
FIG. 2 illustrates, in a schematic plan view, the interleaved electrode configuration of the device of FIG. 1.

Referring to FIG. 2, the drain fingers are shown at 31, and the gate fingers are shown at 32. These fingers are interleaved as shown. They are interconnected at the ends with gate rail 33 interconnecting the ends of the gate fingers, and drain rail 34 interconnecting the drain fingers. For the purpose of defining the structures, in the text here and below, the electrode configurations are referred to as comb structures with parallel fingers attached to and extending from a common rail.

The power capacity of the device is a function of the overall gate and drain length. Accordingly, high power devices have gate and drain fingers with relatively large length-to-width ratios, for example, greater than 5.

In many LDMOS devices, the gate comb electrode is formed in a lower interconnect level, typically in the first interconnect level, and the drain comb electrode is formed in an upper interconnect level. The combination of a large length-to-width ratio of the drain fingers in the drain electrode comb, and the position of the drain electrode comb, i.e. "floating" above the substrate, makes the drain electrode comb susceptible to mechanical failure.

Figure 3:
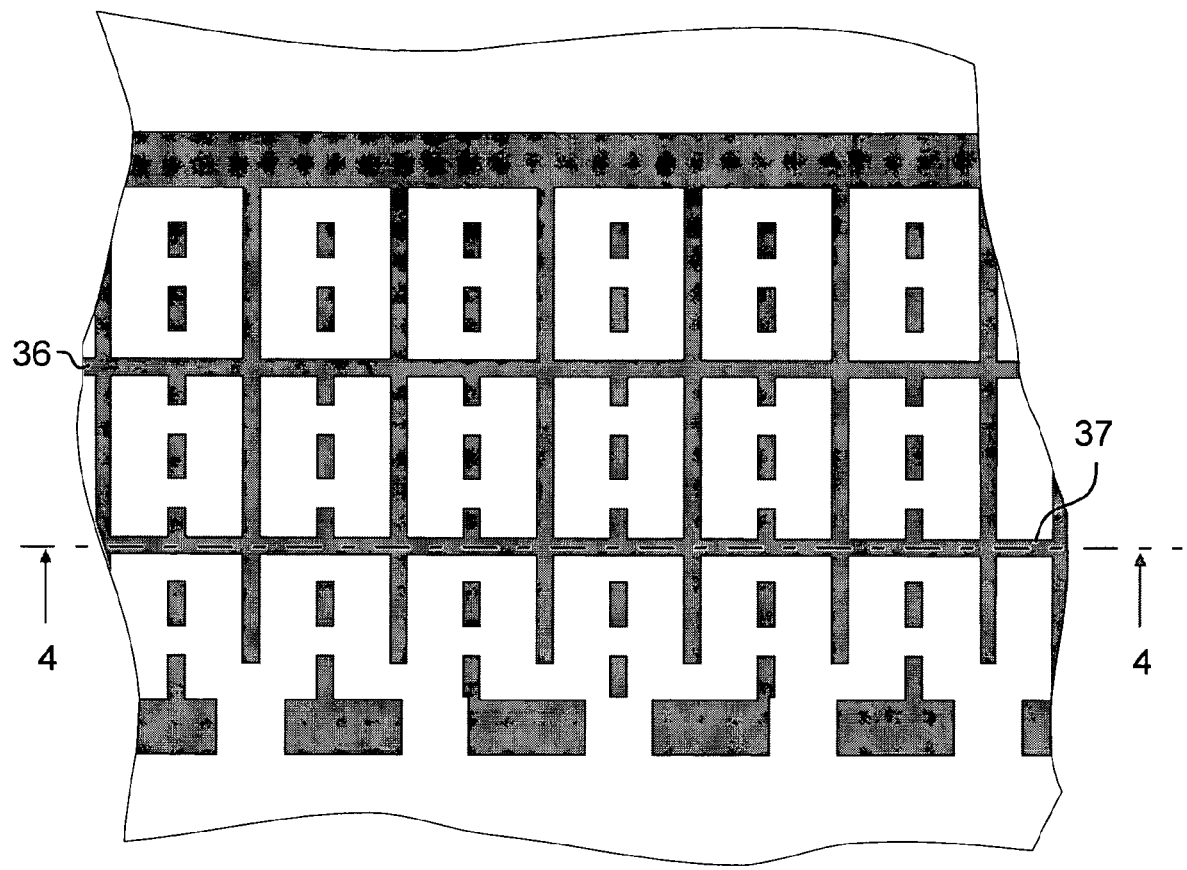
FIG. 3 is a schematic plan view showing interleaved comb electrodes wherein one of the comb structures is provided with cross-connections in accordance with the invention.

To improve the mechanical integrity of the drain electrode comb, according to the invention, cross-connect members are added between the drain fingers as shown in FIG. 3. The cross-connects are indicated at 36, 37. It is evident that the resulting grid structure, with the drain fingers provided with cross-connected members as shown, is mechanically superior to the "floating" drain fingers in the prior art embodiment of FIG. 2.

There are two cross-connections shown in FIG. 3. It should be appreciated that the invention may also be practiced with one cross-connect member, or more than two cross-connect members. The cross-connect member(s) may be formed with no additional process steps. Forming cross-connects merely requires a different lithographic mask design for patterning the metal drain interconnect layer.

If the cross-connected grid that contains the drain fingers is made as part of a single layer, i.e. is formed using a single deposition step, the grid will have inherent structural integrity. The term unitary body, when used below, is intended to describe a structure of a single material formed as a unitary body. While it is possible to form the cross-connects in a step separate from forming the drain fingers, lithographically patterning both from a single deposited metal layer ensures that the rail, the fingers, and the cross-connects are formed as a unitary body. It also provides cost-effective processing.

Figure 4:
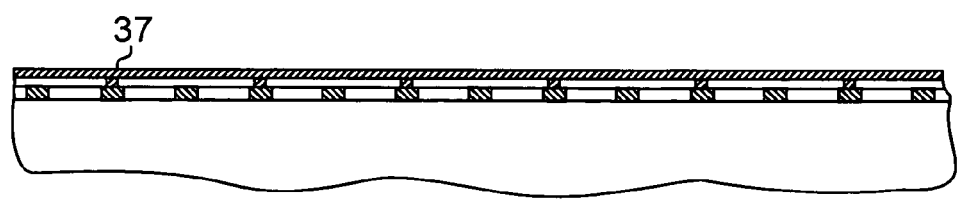
FIG. 4 is a cross section through 4-4 of FIG. 3 showing the gate level interconnections on a first level and a drain finger cross-connection on the second level.
Figure 5:
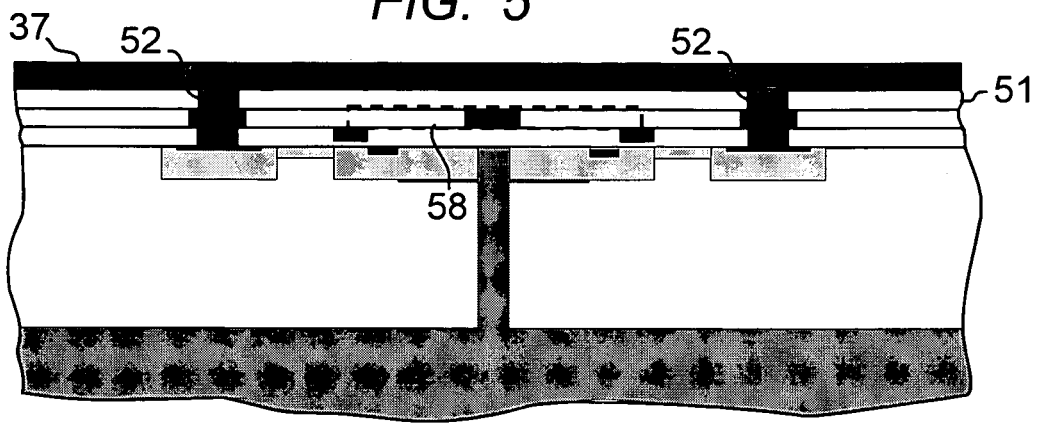
FIG. 5 is a more detailed view of FIG. 4 showing the interlevel dielectric layers.

A section view through 4-4 of FIG. 3 is shown in FIG. 4, with one of the drain finger cross-connects shown at 37. In this figure, some details of the structure have been omitted for simplicity. A partial cross section of the structure of FIG. 3, with more detail, is shown in FIG. 5. This structure has, in addition to the elements shown in FIG. 1, an additional (second) interlevel dielectric layer 51, interlevel plugs 52, and drain finger cross-connect 37.

In the views of FIGS. 4 and 5, the interlevel connections from the drain regions in the substrate to the drain fingers are shown, but the drain fingers are not individually shown since they appear as part of the cross-connect 37. It should be understood that this is a special and optional case, where the interlevel pads and plugs are in the same cross section as the cross-connects. This will be discussed in more detail below.

It will be noted that the vertical spacing between the gate electrode structure, shown at 58, and the drain finger cross-connect 37, is determined by the thickness of interlevel dielectric layer 51. In some cases this thickness may not be sufficient to prevent unwanted capacitive coupling between the gate and drain of the transistor. To reduce the coupling, the thickness of the interlevel dielectric may be made larger than typical. However, other process design considerations may prevent use of that expedient.

Figure 6:
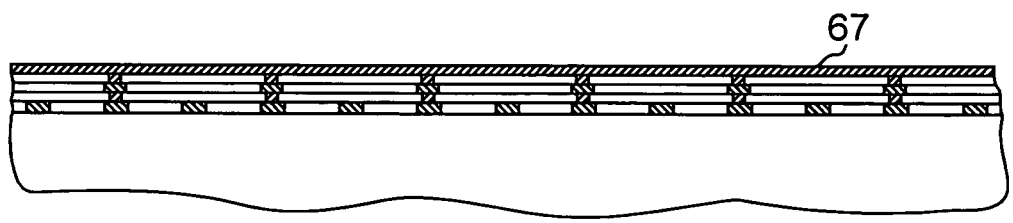
FIG. 6 is a cross section similar to that of FIG. 4 showing the drain finger cross-connections on the third level.
Figure 7:
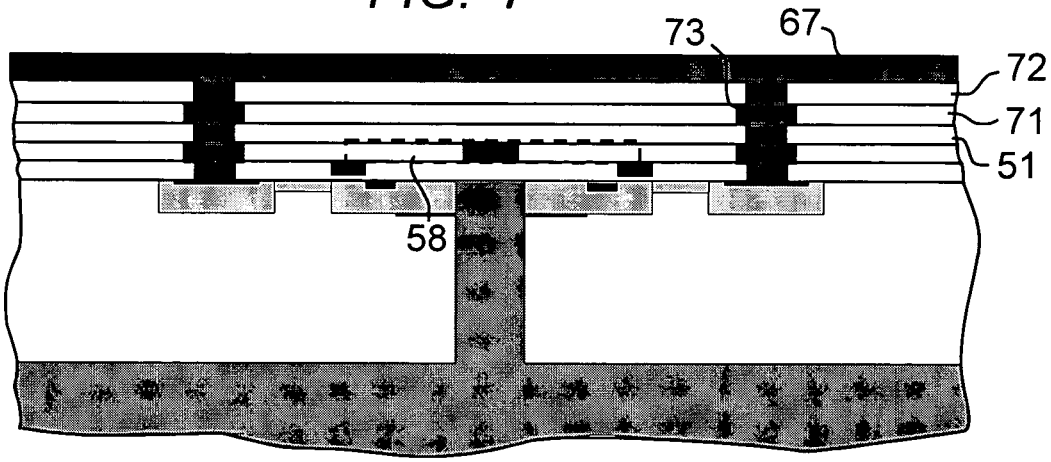
FIG. 7 is a more detailed view of FIG. 6 showing the interlevel dielectric layers and the skipped level in more detail.

An alternative for overcoming gate-drain coupling, is represented by the structure of FIGS. 6 and 7. It will be recalled that the drain finger cross-connects (37) in FIG. 4 are formed at the second level. In FIG. 6 the drain finger cross-connects 67 are formed at the third level. In FIG. 7, a more detailed view similar to that of FIG. 5, in addition to the elements shown in FIG. 5, a third interlevel dielectric layer is shown at 72. Added interlevel plugs are shown at 73, and the drain finger cross-connect in this view is shown at 67. It will be appreciated that the drain finger cross-connect 67 is now separated from the gate electrode 58 by three levels of dielectric, the first interlevel dielectric 51, the second level dielectric 71, and the second interlevel dielectric 72. The increased gate-drain separation obtained as a result of forming the drain finger cross-connects on the third level comes at no additional processing steps, provided the transistor structure has three or more metal levels.

Figure 8:
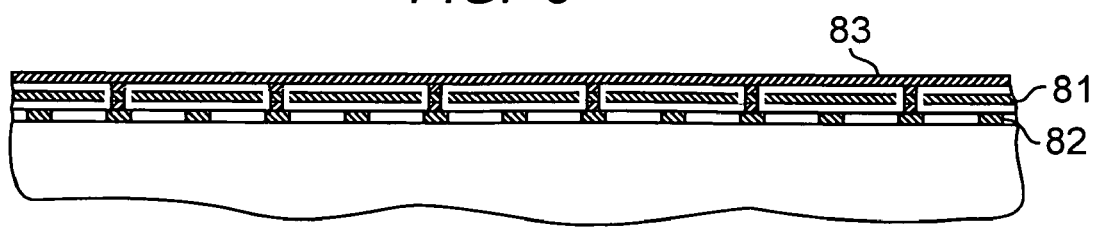
FIG. 8 is a cross section similar to that of FIG. 6 showing a ground plane shielding the drain interconnections from the gate interconnections.
Figure 9:
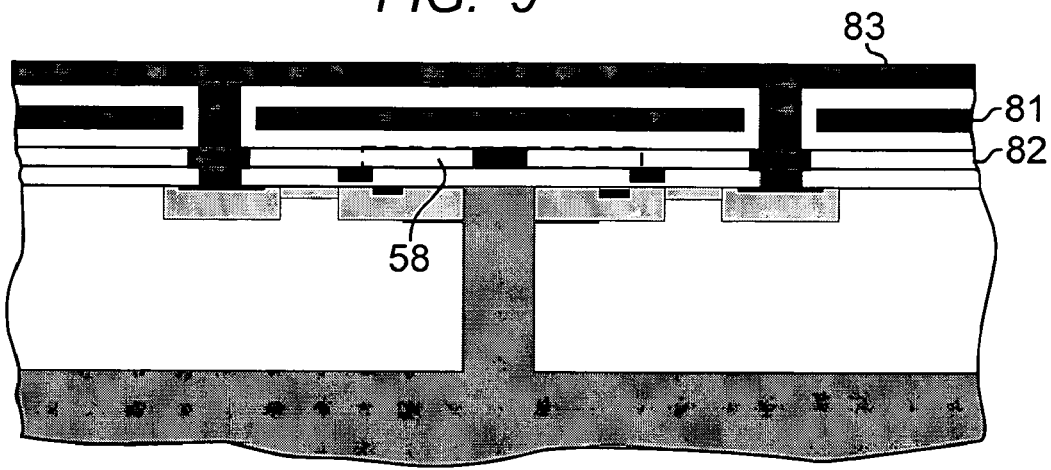
FIG. 9 is a more detailed view of FIG. 8.

Still further protection from gate-source capacitive coupling is obtained using the device design shown in FIGS. 8 and 9. In FIG. 8, a field plate is shown at 81. The field plate is formed between the gate level 82 and the drain finger cross-connect 83. This is shown in more detail in FIG. 9 where the field plate 81 is shown formed at the second level, and shields the gate electrode 58 from the drain finger cross-connect 83. The field plate is electrically connected to ground. The field plate is preferably a continuous sheet of metal, with openings for the interlevel connections to drain fingers 83. However, it may be formed as an interconnected grid structure with grid members underlying the drain finger cross-connects, or underlying the drain finger cross-connects and the drain fingers.

Figure 10:
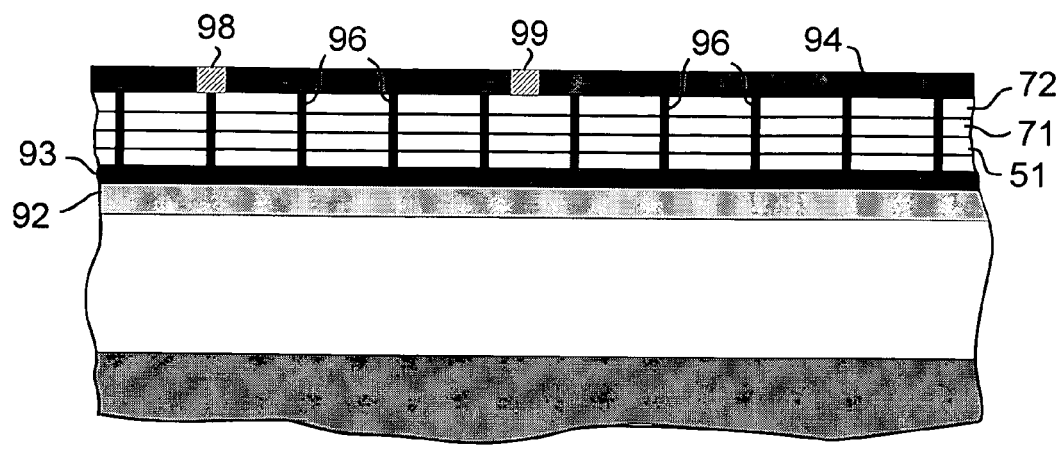
FIG. 10 is a schematic view of the device of FIG. 7, taken in another dimension.

The detailed FIGS. 1, 5, 7, and 9 are views taken through the extended fingers of the device, i.e. normal to the gate and drain fingers. A view parallel to a drain finger is shown in FIG. 10, where the drain region is shown at 92, the drain contact at 93, and one of the drain electrode fingers at 94. The interlevel pads and plugs to the drain region are shown schematically at 96. The number and spacing of interlevel connections between the drain region and the drain fingers is a matter of design. The cross-connects would not normally appear as distinct elements in this view, but would extend between drain fingers in a direction normal to the figure. To further explain the structure, the position of the cross-connects is indicated by the cross-hatched regions 98 and 99. The position indicated at 98 in the figure corresponds to the case represented in FIGS. 5, 7, and 9. Embodiments where the drain interlevel pads and plugs do not align with the cross-connects are represented by cross-connect position 99.

The cross-connects between adjacent drain fingers also do not require alignment, but may be offset in any desired pattern. To illustrate, aligned cross-connects might appear as the pattern in a window screen, offset cross-connects might appear in the easily recognized pattern of the mortar in a conventional brisk wall.

Figure 11:
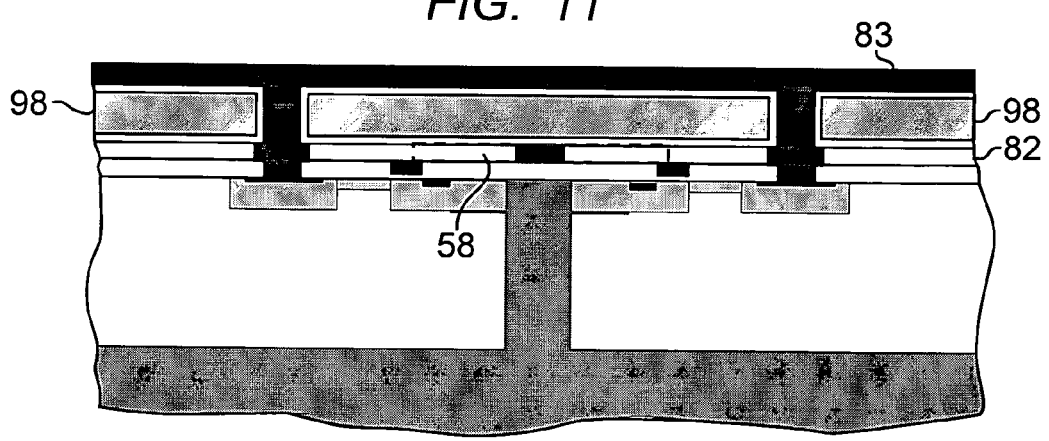
FIG. 11 is a view similar to that of FIG. 9 showing an alternative approach to isolating the gate electrode structure from the drain fingers and cross-connects.

An alternative to the field shield of FIG. 9 for electrically isolating the gate and drain fingers and cross-connects is shown in FIG. 11, where at least part of the physical space 98 between the gate level and the drain finer level has been removed leaving air voids 98. This results in a true air-isolated structure. The interlevel dielectric in regions 98 may be removed by etching. To aid in controlling the etching, one of the interlevel dielectric layers may include an etch stop layer of, for example, silicon nitride.

Figure 12:
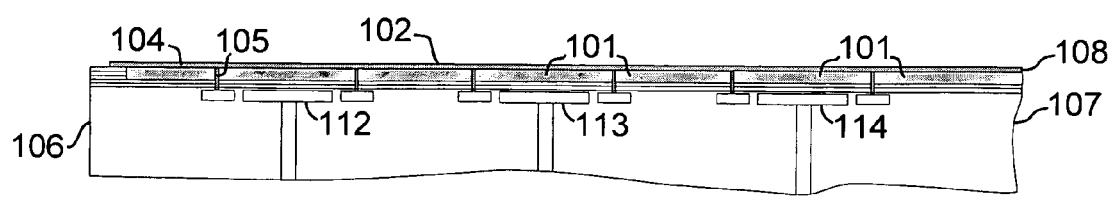
FIG. 12 is a schematic view similar to FIG. 7 showing a preferred embodiment of the invention where balance members are added to the drain cross-connects.

In the embodiment of FIG. 11 it will be intuitively understood that some of the support structure for the cross-connects has been removed to effect the air isolation. FIG. 12 shows an embodiment where a mechanical stabilizing structure has been added in the form of extensions to the cross-connects. In FIG. 12 three elongated transistors, 112, 113, and 114, are shown schematically. These transistors may be part of a comb array of many more elongated transistors or may represent a grouping of three transistors in a device with several or many such groups. In the illustration, edge 106 is intended to represent the edge of the chip, and the transistor 112 represents the outermost transistor in the comb array. The edge designated 107 is intended as a cutaway edge in the interior of the comb array. The air isolation spaces are designated 101. The cross-connect, as described in connection with FIG. 7 is shown at 102, and the drain interlevel interconnection for the outermost drain element in the array is shown at 105. A portion of the mechanical stabilizer system is shown at 104, where the beam that forms cross-connect 102 is deliberately extended past the last interlevel drain connection. The cross-connect extensions may be formed integrally with the cross-connect, and thus do not require additional processing.

Figure 13:
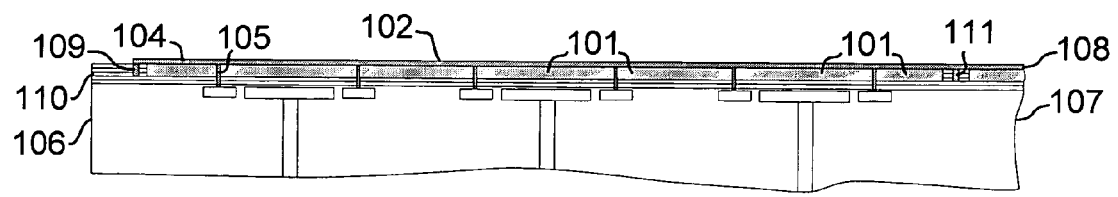
FIG. 13 is a schematic view like FIG. 12 where the balance members are anchored for additional support.

The assembly of FIG. 12 may be mechanically stabilized even more effectively by providing anchors for the extended beams 104. This embodiment is shown in FIG. 13 where a pillar 109 is provided at the end of the beam extension 104. The pillar is anchored in one or more interlevel dielectrics, for example, interlevel dielectric 110. The pillar may be anchored to the substrate, however it is preferred that the pillar be anchored above the substrate to reduce drain/substrate capacitance. Pillar 109 is representative of one or more pillars formed at the ends of the beam extensions. If desired, intermediate pillars may be formed as shown at 110. These also are anchored in an interlevel dielectric. The pillars may be formed in the same manner as described earlier for the drain interlevel connections.

Various other mechanical stabilizer designs, based on the principles implicit in the above, may occur to those skilled in the art. For example, the extensions shown in both FIGS. 12 and 13 could also be applied to the ends of the drain fingers. These may be used in place of, or in addition to, those already described.

The two approaches to mechanical stabilization of the drain finger/cross-connect grid are shown with an air-isolated grid. Alternatively, these expedients can be used in the embodiments shown in FIGS. 5 and 10, for example, where the grid is also supported by the interlevel dielectric layers. The mechanical stabilizers add to the overall robustness of the electrode design.

In the embodiments described above, the drain regions, the interlevel drain contact plugs, and the drain electrode comb, are all shown essentially in vertical alignment. Since the drain electrode comb is formed on an upper interconnect level, the drain electrode comb may be laterally offset with respect to the drain regions in the device.

As mentioned earlier, MOS devices similar to that described here in detail can be made with different configurations. For example, the gate and drain electrode interconnections may be reversed, i.e. the drain interconnections made at a lower level, and the gate interconnections at an upper level.

Also, in some devices the drain and source may be reversed. This reversal is a well-known option in some devices, and source/drain may be considered equivalent from the standpoint of the main features of the invention.

While the invention is described above in the context of LDMOS power transistors, other transistor devices or arrays with interconnected drains and/or interconnected gates may also benefit from use of the design principles of the invention.

Various additional modifications of this invention will occur to those skilled in the art. All deviations from the specific teachings of this specification that basically rely on the principles and their equivalents through which the art has been advanced are properly considered within the scope of the invention as described and claimed.

The invention claimed is:

1. An MOS device comprising:
   a. a substrate,
   b. source and drain regions formed in the substrate,
   c. MOS gates formed on the substrate,
   d. a lower interconnect level on the substrate,
   e. an MOS gate electrode in the lower interconnect level for interconnecting the MOS gates, the MOS gate electrode having a comb structure with a gate rail and a plurality of gate electrode fingers extending from the gate rail,
   f. an upper interconnect level,
   g. a drain electrode in the upper interconnect level for interconnecting the drain regions, the drain electrode having a comb structure with a drain rail and a plurality of drain electrode fingers extending from the drain rail,
   h. at least one cross-connect spaced from the drain rail and connecting the drain electrode fingers.

2. The device of claim 1 wherein the drain electrode fingers and the cross-connect comprise a unitary metal body.

3. The device of claim 1 comprising at least one additional interconnect level between the lower interconnect level and the upper interconnect level.

4. The device of claim 3 wherein the device has at least three interconnect levels, with the lower interconnect level comprising the first interconnect level, the additional interconnect level comprising the second interconnect level, and the upper interconnect level comprising the third interconnect level.

5. The device of claim 1 comprising at least two cross-connects with the cross-connects parallel to each other and parallel to the drain rail.

6. The device of claim 1 wherein the drain fingers have a length-to-width ratio greater than 5.

7. The device of claim 1 wherein the gate electrode fingers and the drain electrode fingers are interleaved.

8. The device of claim 3 wherein the additional level comprises a grounded field plate.

9. The device of claim 3 wherein at least a portion of the additional interconnect level is removed leaving an air void.

10. The device of claim 1 further comprising:
  i. a beam extension attached to, and integral with, the cross-connect, the beam extension extending substantially past the said comb structure.

11. The device of claim 10 wherein the beam extension terminates with a column extending toward the substrate, and anchored in the lower interconnect level.

12. Method for making an MOS device comprising the steps of:
  a. providing a substrate,
  b. forming source and drain regions in the substrate,
  c. forming MOS gates on the substrate,
  d. forming an MOS gate electrode on the substrate for interconnecting the MOS gates, the MOS gate electrode having a comb structure with a gate rail and a plurality of gate electrode fingers extending from the gate rail,
  f. depositing at least one interlevel dielectric layer on the MOS gate electrode,
  g. forming a drain electrode on the interlevel dielectric layer, the drain electrode having a comb structure with a drain rail and a plurality of drain electrode fingers extending from the drain rail, and having at least one cross-connect spaced from the drain rail and connecting the drain electrode fingers.

13. The method of claim 12 wherein at least three interconnect levels are formed on the substrate, with the gate electrode formed in the first interconnect level and the drain electrode formed in the third interconnect level.

14. The method of claim 12 wherein at least two cross-connects are formed, with the cross-connects parallel to each other and parallel to the drain rail.

15. The method of claim 13 wherein the first and third levels are separated by at least one additional level, and a grounded field plate is formed on the at least one additional level.

16. The method of claim 12 wherein the drain electrode and the cross-connects are formed by steps comprising:
  depositing a metal layer on the interlevel dielectric layer, and
  patterning the metal layer to form both the drain fingers and the cross-connects.

17. The method of claim 16 wherein the metal layer is patterned lithographically.

18. The method of claim 12 wherein at least part of the interlevel dielectric is removed leaving an air void.

19. The method of claim 12 wherein a beam extension is attached to, and formed integral with, the cross-connect, the beam extension extending substantially past the said comb structure.

20. The method of claim 19 including the step of forming a column to support the beam extension, the column extending toward the substrate and anchored in an interlevel dielectric layer.

* * * * *